United States Patent
Watanabe et al.

(10) Patent No.: US 9,163,886 B2
(45) Date of Patent: Oct. 20, 2015

(54) METHOD FOR MANUFACTURING A COOLING DEVICE FOR ELECTRONIC COMPONENT

(75) Inventors: Masahiro Watanabe, Toyota (JP); Shintaro Suzuki, Nagoya (JP)

(73) Assignee: TOYODA IRON WORKS CO., LTD., Toyota-shi (JP)

(*) Notice: Subject to any disclaimer, the term of this patent is extended or adjusted under 35 U.S.C. 154(b) by 266 days.

(21) Appl. No.: 13/696,510

(22) PCT Filed: Nov. 22, 2011

(86) PCT No.: PCT/JP2011/076966
§ 371 (c)(1),
(2), (4) Date: Nov. 6, 2012

(87) PCT Pub. No.: WO2012/073766
PCT Pub. Date: Jun. 7, 2012

(65) Prior Publication Data
US 2013/0140011 A1 Jun. 6, 2013

(51) Int. Cl.
*F28F 3/12* (2006.01)
*H01L 23/36* (2006.01)
*H01L 23/473* (2006.01)
*H05K 7/20* (2006.01)

(52) U.S. Cl.
CPC . *F28F 3/12* (2013.01); *H01L 23/36* (2013.01); *H01L 23/473* (2013.01); *H05K 7/20472* (2013.01); *H05K 7/20509* (2013.01); *H01L 2924/0002* (2013.01); *Y10T 29/4935* (2015.01); *Y10T 29/49353* (2015.01)

(58) Field of Classification Search
CPC .................. H01L 23/36; H01L 23/473; H01L 2924/0002; H01L 2924/00; H05K 7/20472; H05K 7/20509; F28F 3/12; B23P 15/26; B21D 53/02; B21D 53/04; B21D 53/08; Y10T 29/4935; Y10T 29/49364; Y10T 29/49366; Y10T 29/49377; Y10T 29/49353
See application file for complete search history.

(56) References Cited

U.S. PATENT DOCUMENTS

2008/0239671 A1   10/2008  Amano et al.
2011/0240476 A1*  10/2011  Wang et al. .............. 205/67

FOREIGN PATENT DOCUMENTS

| JP | A-61-290036   | 12/1986 |
| JP | A-2002-289995 | 10/2002 |
| JP | A-2005-322879 | 11/2005 |
| JP | A-2008-221951 | 9/2008  |
| JP | A-2010-251382 | 11/2010 |

OTHER PUBLICATIONS

Feb. 28, 2012 International Search Report issued in International Patent Application No. PCT/JP2011/076966.
Aug. 19, 2014 Office Action issued in Japanese Patent Application No. 2010-267509 (with translation).
Nov. 15, 2014 Office Action issued in Chinese Application No. 201180029462.0.
Jan. 20, 2015 Office Action issued in Japanese Application No. 2010-267509.

* cited by examiner

*Primary Examiner* — Sarang Afzali
(74) *Attorney, Agent, or Firm* — Oliff PLC

(57) ABSTRACT

A cooling device for an electronic component, includes: a metal pipe; a metal foil provided on an external surface of the metal pipe; and a thermally-cured resin layer that bonds the external surface of the metal pipe and the metal foil together.

2 Claims, 6 Drawing Sheets

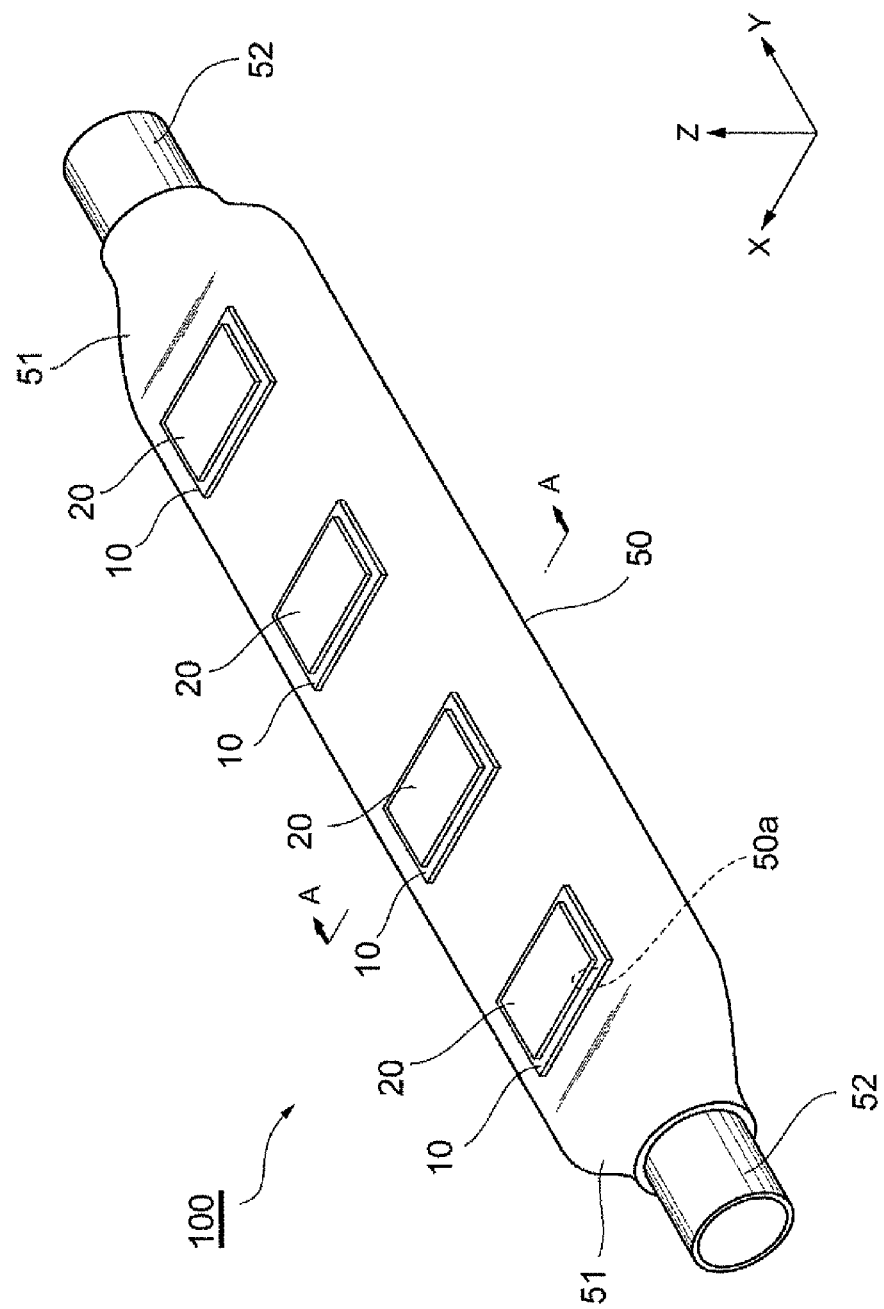

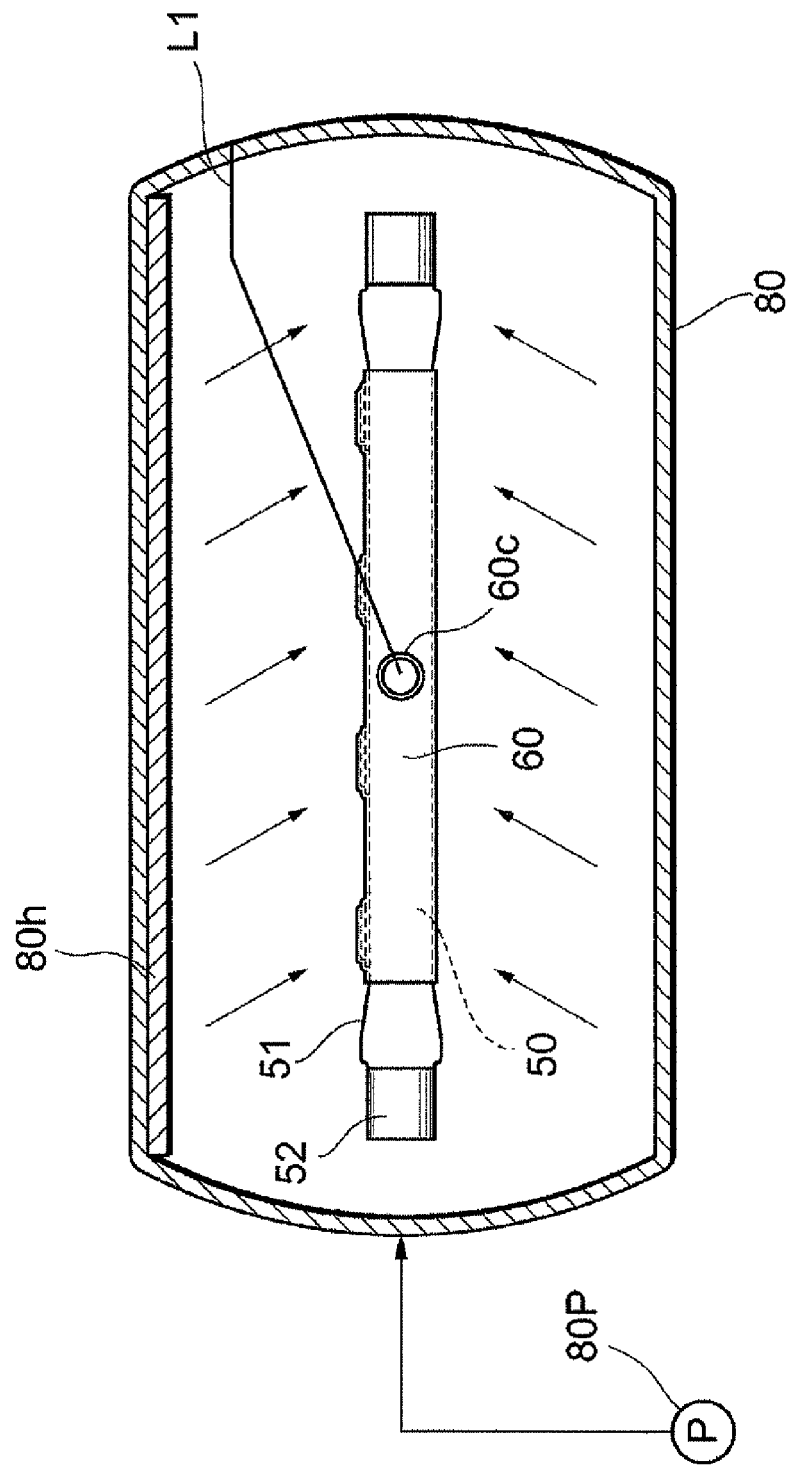

METHOD FOR MANUFACTURING A COOLING DEVICE FOR ELECTRONIC COMPONENT

TECHNICAL FIELD

The present invention relates to a cooling device for an electronic component, and more specifically to a cooling device for an automotive electronic component such as a power semiconductor in an inverter provided in an electric vehicle, a fuel cell vehicle, a hybrid electric vehicle, and the like.

BACKGROUND ART

In recent years, an electric vehicle, a fuel cell vehicle, a hybrid electric vehicle and the like using electricity as a driving force instead of an internal combustion engine have drawn attention. In these vehicles, power is obtained by supplying electrical energy stored in batteries to motors via inverters and driving them. Since high-currents flow through these inverters, heat generated at electronic components called power semiconductors such as IGBTs (insulated-gate type bipolar transistors) constituting the inverters increases. Accordingly, a cooling device having a large cooling capacity for cooling the electronic components is required.

Patent Document 1 (Japanese Patent Application Publication No. 2008-221951) discloses a method in which an electronic component (an inverter 10) is fixed directly on a cooling device including a metal pipe, and a coolant is caused to flow in the metal pipe of the cooling device to cool the electronic component.

RELATED ART DOCUMENT

Patent Document

Patent Document 1: Japanese Patent Application Publication No. 2008-221951

SUMMARY OF THE INVENTION

Problem to be Solved by the Invention

However, a surface of a metal pipe may often have small irregularities such as undulations formed, for example, at the time of manufacturing the metal pipe, and even if an electronic component having a function of electric insulation from the metal pipe is fixed directly on the surface of the metal pipe, minute voids occur because the irregularities between the electronic component and the surface of the metal pipe cannot be absorbed. As a result, an efficiency of cooling the electronic component is not sufficient.

The present invention is made in view of the above problems, and an object of the present invention is to provide a cooling device for an electronic component, which is able to sufficiently increase an efficiency of cooling an electronic component, and a method for manufacturing the same.

Means for Solving the Problem

The present invention provides a cooling device for an electronic component, comprising: a metal pipe; a metal foil provided on an external surface of the metal pipe; and a thermally-cured resin layer that bonds the external surface of the metal pipe and the metal foil together.

According to the first aspect of the present invention, it has the following functions. First, it is able to easily bond, with few voids, the external surface of the metal pipe having irregularities thereon and the metal foil together, with the use of flexibility of the resin before thermal curing. The electronic component is bonded together on the metal foils by soldering or the like with few voids, so that the voids between the electronic component and the external surface of the metal pipe are finally reduced sufficiently and they thermally contact each other in a state where they have an electric insulation function. As a result, the efficiency of cooling the electronic component is increased.

It is preferably that the thermally-cured resin layer contains ceramic particles. The efficiency of cooling is more increased because the ceramic particles have higher thermal conductivity than resin.

A method for manufacturing a cooling device for an electronic component according to the present invention, comprises: an accommodation step of accommodating, in a flexible container, a structure including a metal pipe, a thermosetting resin sheet at a B-stage, which is laminated on an external surface of the metal pipe, and a metal foil laminated on the resin sheet; a pressure reduction step of reducing pressure in the flexible container; a pressure application step of applying pressure by gas to the flexible container in which the pressure has been reduced, from an outside; and a heating step of heating the resin sheet in a state where the pressure reduction and the pressure application have been performed.

According to the above method, by accommodating the metal pipe laminated on the thermosetting resin sheets and the metal foils at the B-stage in the flexible container, and reducing the pressure in the flexible container, the flexible container is pushed against the metal pipe, the metal foils are adhered to the resin sheets, and the resin sheets are adhered to the metal pipe. Therefore, voids in both adhesive interfaces between the metal foils and the resin sheets and between the resin sheets and the metal pipe are removed. Further, by applying pressure to the flexible container from the outside while the pressure in the flexible container is reduced, the metal foils and the resin sheets, the resin sheets and the metal pipe are more adhered to each other, and the minute voids in both adhesive interfaces are also more removed. Then, by heating the resin sheets while in the state where the pressure reduction and the pressure application, while in a state where the metal foils and the resin sheets, and the resin sheets and the metal pipe are adhered to each other, i.e., voids are removed, the thermosetting resin is cured. Consequently, it can easily obtain the cooling device which voids existing in both adhesive interfaces between the metal pipe-foils and the resin sheets and between the resin sheets and metal pipe are reduced It is preferably that further comprising after the heating step, an annealing step of taking out the structure from the flexible container and heating the resin sheet at a temperature higher than that in the heating step. This causes curing of the resin sheets to proceed more sufficiently, whereby the metal pipe and the metal foils can be bonded together more firmly.

Effect of the Invention

According to the present invention, the cooling device for an electronic component having the high efficiency of cooling with an electric insulation function can be obtained.

BRIEF DESCRIPTION OF THE DRAWINGS

FIG. 1 is a perspective view illustrating a cooling device for an electronic component according to one embodiment of the present invention.

FIG. 4 is a cross-sectional view following FIG. 3(b) illustrating the first example of the method for manufacturing the cooling device for electronic component of FIG. 1.

MODES FOR CARRYING OUT THE INVENTION

Figure 2A:
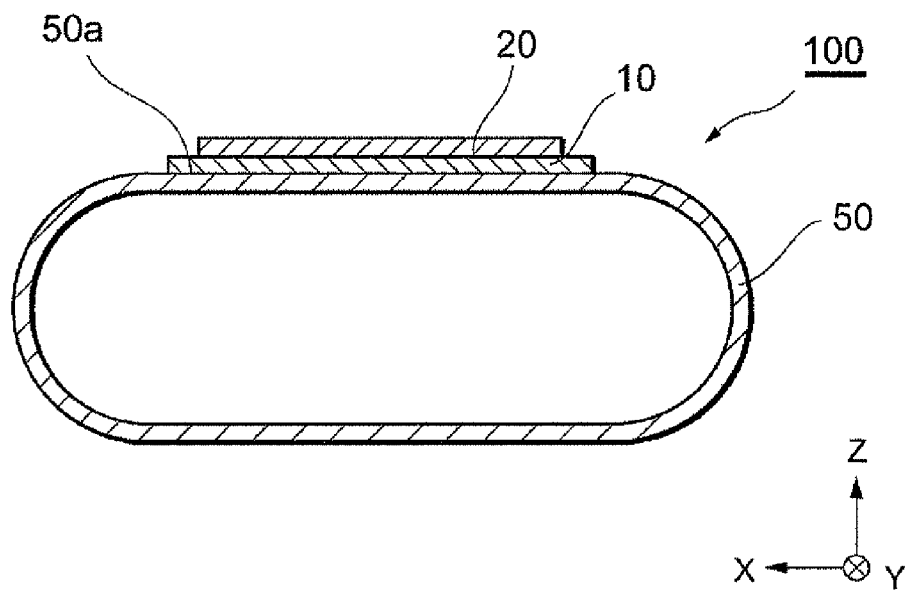
FIG. 2(a) is an A-A cross-sectional view of FIG. 1.

Hereinafter, with reference to the drawings as needed, preferred embodiments of the present invention will be described in detail. Note that, in the drawings, the same reference signs are assigned to the same elements, and redundant explanation is omitted. Dimension ratios in the drawings are not limited to ratios shown therein.

<First Embodiment of Cooling Device for Electronic Component>

FIG. 1 is a perspective view illustrating a basic configuration of a cooling device 100 for an electronic component according to one example of the embodiments of the present invention. FIG. 2(a) is an A-A cross-sectional view of the cooling device 100 for an electronic component in FIG. 1.

The cooling device 100 for an electronic component according to the present embodiment mainly includes a metal pipe 50, metal foils 20 provided on portions 50a of an external surface of the metal pipe 50, and resin layers 10 that bond the metal pipe 50 and the metal foils 20 together, as illustrated in FIG. 1.

(Metal Pipe)

The metal pipe 50 is formed in a flat plate shape in which an upper surface and a lower surface are parallel with each other and both side surfaces are round to form a tubular shape as a whole. A size of the metal pipe 50 is not limited in particular, but may be, for example, 100 to 400 mm in length in an axial direction (Y-direction), 10 to 30 mm in height (Z-direction), and 30 to 60 mm in width (X-direction).

The metal pipe 50 in a tubular shape is provided with, at respective ends in the axial direction, nozzles 52 for inflow or outflow of a coolant via diameter expansion portions 51, so that the coolant is able to flow within the metal pipe 50.

As a metal for forming the metal pipe 50, the diameter expansion portions 51, and the nozzles 52, for example, copper, aluminum, or alloy of these metals may be used, but copper or copper alloy is particularly preferable because copper and copper alloy are easy to process and have high thermal conductivity. A thickness of the metal plate may be 0.5 to 2 mm, for example.

Figure 2B:
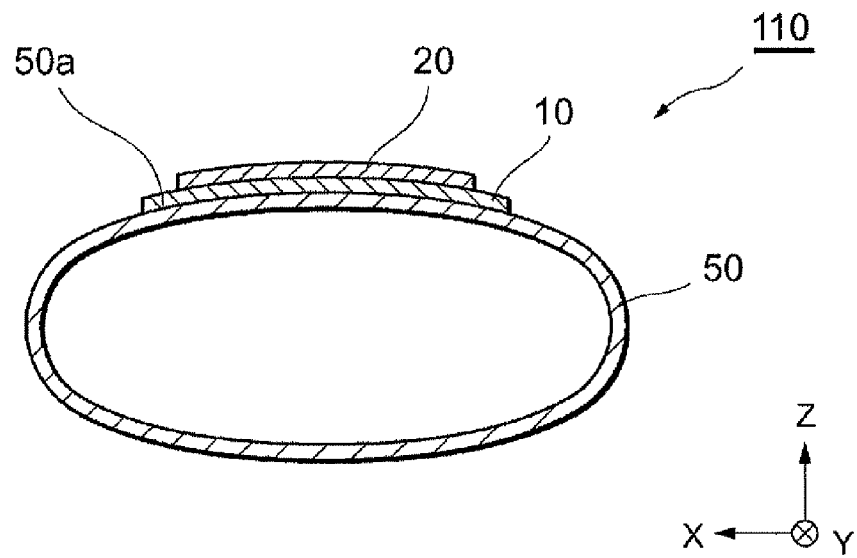
FIG. 2(b) is a cross-sectional view illustrating an example of transforming the metal pipe 50 of FIG. 1.

Note that, as illustrated in FIG. 2(b), the metal pipe 50 need not be in a flat plate shape in which an upper surface and a lower surface are parallel with each other, and may have a convex shape which is slightly round in a width direction (X-direction) and/or a lengthwise direction (Y-direction).

Further, the metal pipe 50 may be configured to accommodate an inner tube, as a configuration other than FIG. 2(a). The number of inner tubes is not limited.

(Electrically Insulating Resin Layer)

Referring back to FIG. 1, on the external surface of the metal pipe 50, the resin layers 10 that bond the external surface of the metal pipe 50 and the metal foils 20 together are laminated. A shape of each resin layer 10 is rectangular in the present embodiment, but is not limited in particular. The number of resin layers 10 is also not limited in particular, but in the present embodiment, resin layers each one of which has one layer are aligned in a line along the axial direction on the external surface of the metal pipe 50. A size of one resin layer 10 is also not limited in particular, but in view of creeping withstand voltage between the metal foil 20 and the metal pipe 50, it is necessary to make the resin layer 10 larger than a size of the metal foil 20 that is attached on a top of the resin layer 10. A creepage distance between the metal foil 20 and the metal pipe 50 is determined in view of current and voltage in an electronic component to be mounted. Further, a thickness of the resin layer 10 is also not limited in particular, but it is preferable that the resin layer 10 has a thickness which satisfies a voltage withstanding performance required of the electronic component.

Each resin layer 10 is an electrically insulating resin layer formed by curing a thermosetting resin, and it adheres to the metal pipe 50 and adheres to the metal foil 20. As the thermosetting resin for forming the resin layer 10, various known thermosetting resins such as an epoxy resin may be used.

It is preferable that the thermosetting resin for forming the resin layer 10 contain electrically insulating ceramic particles in addition to a resin component cured by cross-linking. In a case where the thermosetting resin contains ceramic particles, the efficiency of cooling the electronic component is further increased because the ceramic particles have higher thermal conductivity than resin. Such ceramic particles include, for example, alumina particles, boron nitride particles, and aluminum nitride particles. A particle diameter of each of these particles is not limited in particular. Further, the content of the ceramic particles is not limited in particular.

(Metal Foil)

One metal foil 20 is bonded to each resin layer 10. A size and a shape of the metal foil 20 are not limited in particular and may be set as needed in accordance with a shape of the electronic component which should be fixed, but it is preferable that the metal foil 20 have an area smaller than that of the resin layer 10. A thickness of the metal foil 20 is also not limited in particular, but it is preferable that the metal foil 20 have a thickness and an area which allow a current capacity capable of driving the electronic component. As the metal foil 20, a metal foil which is manufactured by a rolling method or the like may be used.

As a metal for forming the metal foil 20, for example, copper, copper alloy, aluminum, or the like may be used, and copper is preferable among them because of its high electric conductivity.

With the cooling device 100 for an electronic component according to the present embodiment, the resin layer 10 formed by curing a thermosetting resin is able to easily bond, with few voids, the external surface of the metal pipe 50 having irregularities thereon and the metal foil 20 together, with the use of flexibility of the resin before thermal curing. Subsequently, the electronic component and the metal foils 20 are bonded together by soldering or the like with few voids, so that the voids between the electronic component and the external surface of the metal pipe 50 are reduced sufficiently and they thermally contact each other in a state where they have an electric insulation function. As a result, the efficiency of cooling the electronic component is increased.

<First Example of Method for Manufacturing Cooling Device for Electronic Component>

Next, a first example of a method for manufacturing the cooling device 100 for an electronic component according to the above embodiment will be described with reference to FIG. 2 to FIG. 4.

Figure 3A:
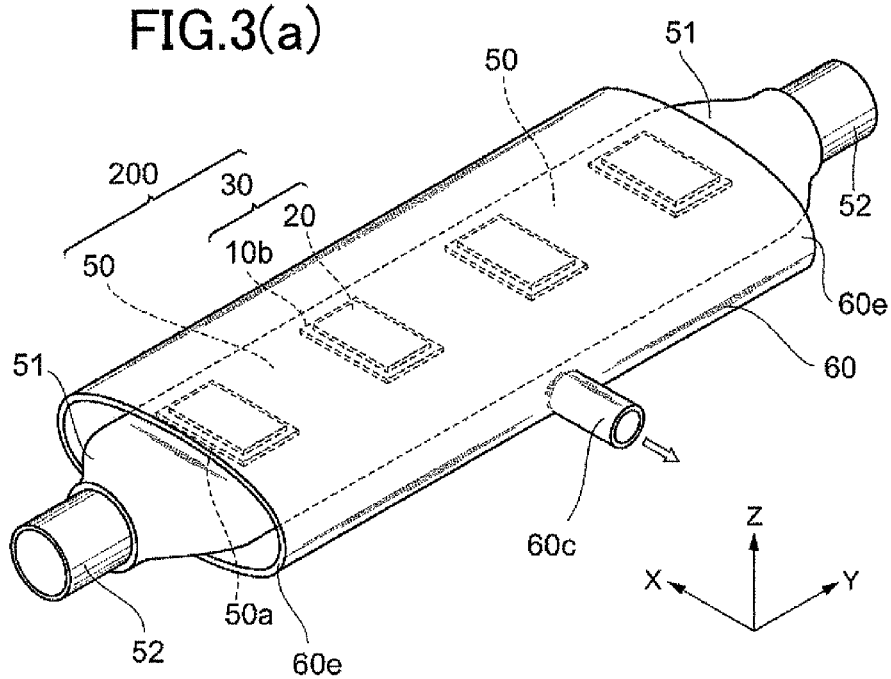
FIG. 3(a) is a perspective view illustrating a first example of a method for manufacturing the cooling device for electronic component of FIG. 1.
Figure 3B:
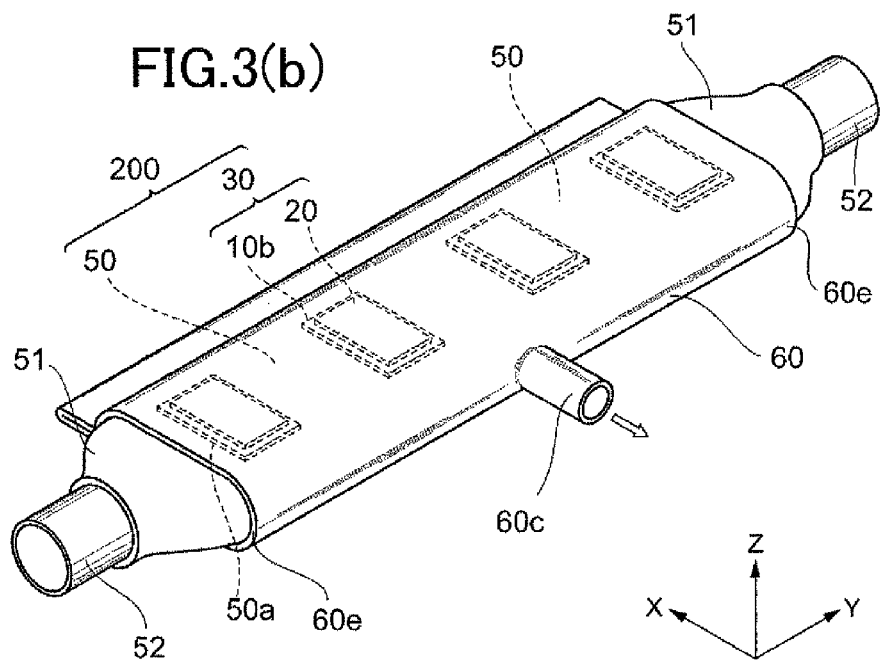
FIG. 3(b) is a perspective view following FIG. 3(a) illustrating the first example of the method for manufacturing the cooling device for electronic component of FIG. 1.

Initially, as illustrated in FIG. 3(a), the metal pipe 50 provided with the diameter expansion portions 51 and the nozzles 52 at respective ends in the axial direction is prepared.

Then, rectangular thermosetting resin sheets 10b at a B-stage as illustrated in FIG. 3(a) are prepared.

Here, an A-stage, the B-stage, and a C-stage of the thermosetting resin will be described.

The A-stage is an early state in a curing reaction of the thermosetting resin. At the A-stage, the thermosetting resin is dissolved in a solvent and further is melted by heating, and it is difficult to maintain a sheet shape.

The B-stage is an intermediate state in the curing reaction of the thermosetting resin. At the B-stage, the thermosetting resin is not completely dissolved in the solvent and is not completely melted even if the resin is heated, and the thermosetting resin is further curable and is able to maintain a sheet shape.

The C-stage is a final stage in the curing reaction of the thermosetting resin. At the C-stage, the resin is insoluble in the solvent and is not melted even if it is heated.

As the thermosetting resin at the B-stage, any known thermosetting resin may be preferably selected, but an epoxy resin is preferable. The epoxy resin contains a prepolymer component having an epoxy group and a curing agent. It is preferable that this thermosetting resin contain electrically insulating ceramic particles as described above.

Such thermosetting resin sheet 10b at the B-stage may be formed, for example, by applying an epoxy resin at the A-stage, which contains a solvent, on a plate-like base material, and then heating the epoxy resin to vaporize the solvent to some extent, whereby cross-linking of thermosetting resin molecules is caused (half-cured).

Then, such thermosetting resin sheets 10b at the B-stage are laminated on the portions 50a of the external surface of the metal pipe 50. The rectangular metal foils 20 are further laminated on the laminated thermosetting resin sheets 10b at the B-stage. In this way, a structure 200 including the metal pipe 50, the thermosetting resin sheets 10b at the B-stage, which are laminated on the external surface of the metal pipe 50, and the metal foils 20, which are laminated on the resin sheets 10b, is manufactured. Note that in order to manufacture the structure 200, a laminated body 30 in which the rectangular metal foil 20 is laminated in advance on the thermosetting resin sheet 10b at the B-stage may be laminated such that a thermosetting resin sheet side of the laminated body 30 contacts the portion 50a of the external surface of the metal pipe 50.

(Accommodation Step)

Then, the above-described structure 200 is accommodated in a flexible container 60 as illustrated in FIG. 3(a). Here, the flexible container 60 has a tubular shape and is a container of which both end portions 60e are open, and the structure 200 can be accommodated so as to be covered with the flexible container 60, by inserting the structure 200 from one of the end portions 60e until the diameter expansion portion 51 and the nozzle 52 provided at one end of the metal pipe 50 come out from the other one of the end portions 60e. It is preferable that an internal circumferential length of the flexible container 60 around a Y-axis be made longer than an outer circumferential length of the metal pipe 50 around the Y-axis so that the flexible container 60 has such a size that the structure 200 is accommodated with a sufficient margin in the space in a width direction. With such a size, it is possible to suppress occurrence of the situation where the thermosetting resin sheets 10b at the B-stage and the metal foils 20 thus laminated are displaced or peel off from the portion 50a at which they are laminated on the metal pipe 50, when the structure 200 is inserted into the flexible container 60. Further, the flexible container 60 has a side tube 60c for vacuuming, on a side face portion of the tubular shape.

The structure 200 should be accommodated in the flexible container 60 such that the flexible container 60 covers the laminated bodies 30 each including the thermosetting resin sheet 10b and the metal foil 20, and it is preferable that the flexible container 60 do not cover the diameter expansion portions 51 and the nozzles 52 provided at respective ends of the metal pipe 50. The reason is as follows: if the structure 200 is accommodated in the flexible container 60 such that the structure 200 together with the diameter expansion portions 51 and the nozzles 52 are fully covered with the flexible container 60, pressure is applied uniformly over the whole flexible container 60 at the time of a pressure reduction step and a pressure application step, which will be described later. As a result, it is difficult to apply necessary pressure for removing voids to the thermosetting resin sheets 10b and the metal foils 20, and in addition, the structure 200 may be crushed by the pressure. In view of this, it is preferable that an axial (Y-axis direction) length of the flexible container 60 in a tubular shape be equal to or less than an axial length of the metal pipe 50.

The flexible container 60 is made of, for example, a flexible material such as a silicone rubber, polyimide, polyamideimide, or the like, and is easily deformed when pressure in the container 60 is reduced, and is able to adhere to the metal pipe 50, and the like.

After the structure 200 is accommodated in the flexible container 60, the both end portions 60e of the flexible container 60 and the external surface of the metal pipe 50 are caused to adhere to each other and sealed so that air does not leak. A tape or the like may be used to provide sealing.

(Pressure Reduction Step)

Subsequently, a vacuum is produced in the flexible container 60 through the side tube 60e to reduce the pressure in the container 60. This makes the flexible container 60 adhere to the metal pipe 50, as illustrated in (b) of FIG. 3. The pressure in the container 60 at the time of pressure reduction is not limited in particular, but the pressure is preferably 500 Tarr (0.07 MPa) or less in absolute pressure, and more preferably 400 Torr (0.05 MPa) or less.

(Pressure Application Step)

After the pressure in the flexible container 60 which accommodates the structure 200 therein is reduced as described above, pressure is further applied to the flexible container 60 by gas from the outside while that pressure reduction state is maintained. The pressure of the gas at the time of pressure application is also not limited in particular.

(Heating Step)

Subsequently, in a state where the pressure in the flexible container 60 has been reduced and the pressure has been applied thereto by gas from the outside, heating of the thermosetting resin sheets 10b at the B-stage is started. Here, it is preferable to start heating in a state where the pressure applied to the flexible container 60 is 1 MPa to 5 MPa in gauge pressure, because the thermosetting resin sheets 10b at the B-stage can be bonded to the metal pipe 50 in a state where voids have been reduced by sufficiently pushing the thermosetting resin sheets 10b against the metal pipe 50. Further, a heating temperature and a heating time may be selected according to characteristics of a resin to be used.

Note that these pressure reduction, pressure application, and heating steps may be performed sequentially in an autoclave, for example. FIG. 4 illustrates a state where while the pressure in the flexible container 60 is reduced by producing a vacuum through the side tube 60c of the flexible container 60 via a vacuum line L1 in an autoclave 80, pressure is applied to the flexible container 60 from the outside by a pump 80P, and further the resin sheets 10b are heated by a heater 80h. The pressure in the flexible container 60 is reduced and further the pressure is applied thereto by gas from the outside, whereby the resin sheets 10b and the metal foils 20 are pushed against the metal pipe 50 on which they are laminated, and heating is performed in that state, so that curing of the thermosetting resin sheets 10b proceeds sufficiently to perform bonding.

Subsequently, simultaneously with the completion of the heating to start cooling, the internal and external pressures of the flexible container are released, and whereby the pressure reduction, pressure application, and heating are finished. Then, the structure 200 is taken out from the flexible container 60, and thus, the cooling device 100 for an electronic component according to the above embodiment is obtained.

(Annealing Step)

Note that, after the cooling device 100 for an electronic component is taken out from the flexible container 60, the resin sheets 10b may be heated at a temperature higher than the heating temperature at the heating step in the autoclave 80. This is preferable because the resin sheets 10b are cured more sufficiently, whereby the metal foils 20 and the metal pipe 50 are bonded together more firmly. This heating can be performed, for example, by placing the cooling device 100 for an electronic component into a batch heat curing furnace. Heating conditions are not limited in particular.

According to this example, by reducing the pressure in the flexible container 60 that accommodates the structure 200 including the thermosetting resin sheets 10b at the B-stage laminated on the metal pipe 50, and the metal foils 20 laminated on the thermosetting resin sheets 10b, the flexible container 60 is deformed and an inner wall of the flexible container 60 is pushed against the metal pipe 50. This causes the metal foils 20 to be pushed against the thermosetting resin sheets 10b at the B-stage, thereby removing voids in an adhesive interface between the metal foils 20 and the thermosetting resin sheets 10b. Similarly, the thermosetting resin sheets 10b are pushed against the metal pipe 50, whereby voids in an adhesive interface between the thermosetting resin sheets 10b and the metal pipe 50 are removed.

Further, by applying pressure to the flexible container 60 by gas from the outside while the pressure in the flexible container 60 is reduced, the inner wall of the flexible container 60 is more firmly pushed against the metal pipe 50, whereby the above effect of removing voids is increased. Then, in a state where voids existing in the respective adhesive interfaces between the metal pipe 50 and the resin sheets 10b and between the resin sheets 10b and the metal foils 20 are removed, the resin sheets 10b are cured by heating the resin sheets 10b, whereby bonding in these interfaces is performed.

In the cooling device 100 for an electronic component obtained in this way, voids in the respective adhesive interfaces between the metal foils 20 and the resin sheets 10b and between the resin sheets 10b and the metal pipe 50 are significantly reduced. Further, the resin sheets 10b bond the metal pipe 50 and the metal foils 20 together sufficiently, so that the resin sheets 10b are difficult to peel off from the metal pipe 50 and the metal foils 20 are difficult to peel off from the resin sheets 10b.

Note that as a method for bonding the metal foils 20 and the metal pipe 50 together with the use of the thermosetting resin sheets 10b when the cooling device 100 for an electronic component according to the present embodiment is manufactured, there may be used, other than the above-mentioned method, a method in which the resin sheets 10b on which the metal foils 20 are laminated are attached to the metal pipe 50 by a heat pressing machine or a vacuum-heat pressing machine, a heat roller machine, a transfer molding machine, or the like. However, from the viewpoint that voids can be sufficiently reduced, the manufacturing method according to the above first example is preferable.

<Second Example of Method for Manufacturing Cooling Device for Electronic Component>

Figure 5:
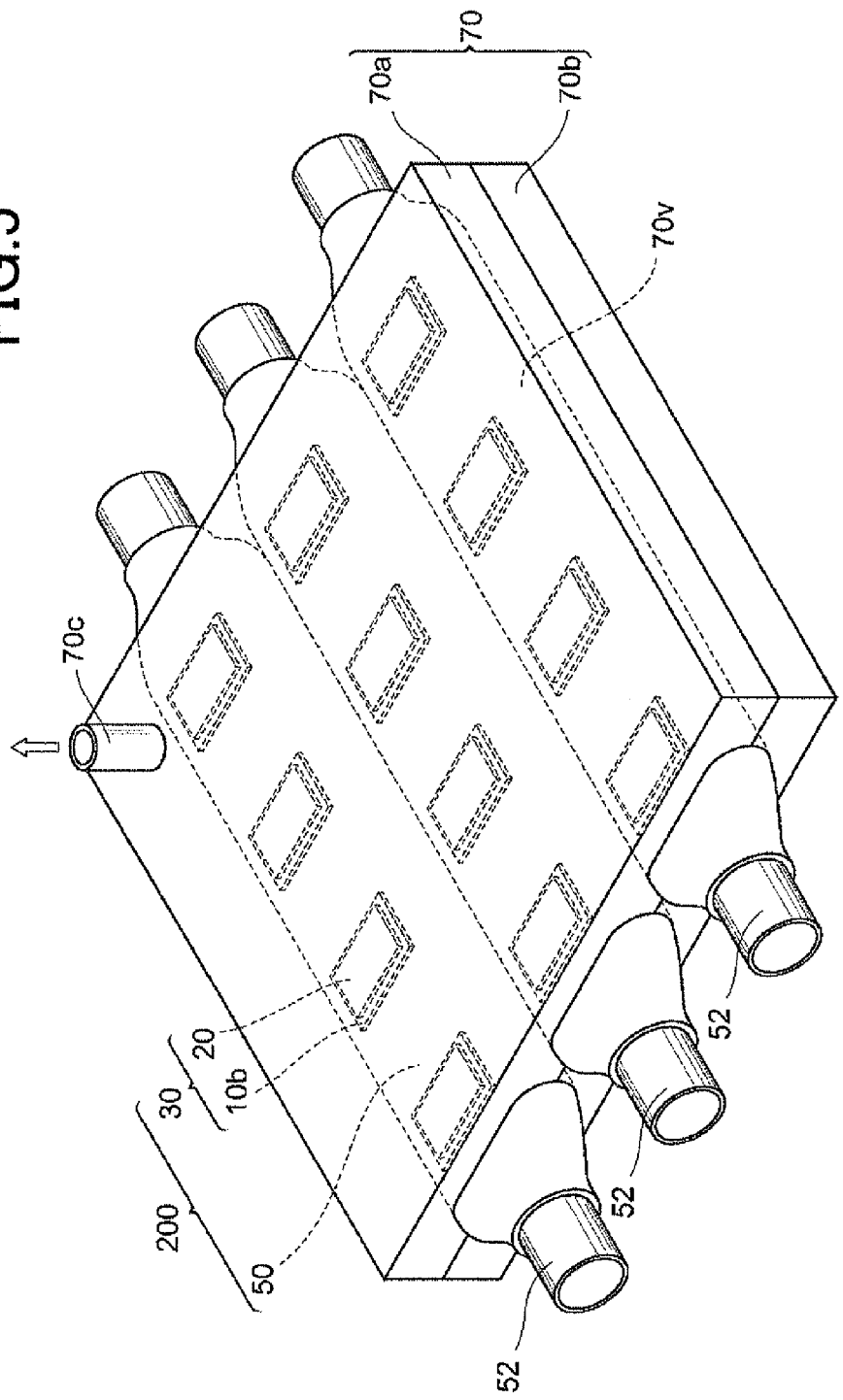
FIG. 5 is a perspective view illustrating a second example of the method for manufacturing the cooling device of the electronic component of FIG. 1.

A second example of a method for manufacturing a cooling device for an electronic component will be described. In this example, only a difference from the first example will be described. In the first example, as illustrated in FIG. 3(a), the film-shaped flexible container 60 is used as a flexible container for pressure reduction. However, as illustrated in FIG. 5, a flexible container 70 including a pair of flexible molds 70a, 70b which can be separated up and down may be used. The flexible container 70 includes an upper mold 70a having a concave portion and a bottom mold 70b having a concave portion, and a shape of a space 70v formed by causing the concave portion of the upper mold 70a and the concave portion of the bottom mold 70b to face each other is formed so as to correspond to a three-dimensional shape of the metal pipe 50, so that the metal pipe 50 can be just accommodated therein. Further, the flexible container 70 has a plurality of spaces 70v so as to be able to accommodate the metal pipes 50 of a plurality of structures 200. Furthermore, the plurality of spaces 70v of the container 70 communicate with each other via a communication passage (not shown), and the upper mold 70a is provided with a side tube 70c for providing communication between the outside and the spaces 70v. Then, by producing a vacuum in each space 70v in the flexible container 70 through the side tube 70c to reduce pressure, it is possible to obtain the same operation and effect as those in the first example. In a case where such a container 70 as in the present embodiment is used, it is easy to simultaneously perform the above pressure reduction step on a plurality of structures 200 with the use of the single container 70, but the above pressure reduction step may be performed only on a single structure 200.

<Exemplary Use of Cooling Device for Electronic Component>

Figure 6A:
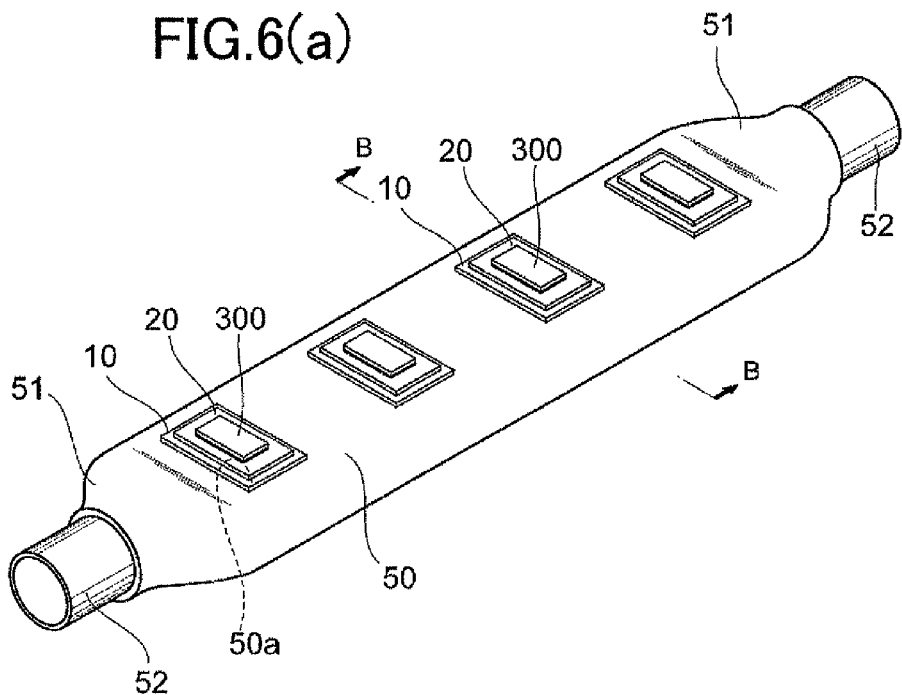
FIG. 6(a) is a perspective view illustrating an example for using the cooling device for an electronic component of FIG. 1 on which power semiconductors 300 are mounted.
Figure 6B:
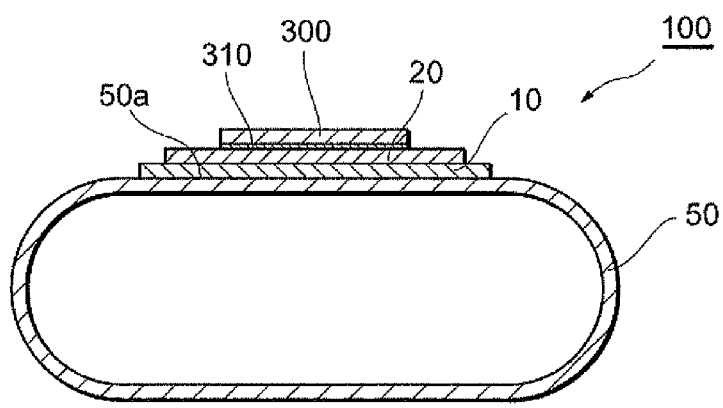
FIG. 6(b) is a B-B cross-sectional view of FIG. 6(a).

One exemplary use of the cooling device 100 for an electronic component according to the present embodiment will be described below. FIG. 6(a) is a perspective view illustrating the cooling device 100 for an electronic component on which power semiconductors 300 are mounted, and FIG. 6(b) is a B-B cross-sectional view of FIG. 6(a). The power semiconductor 300 can be mounted by soldering its radiating surface onto the metal foil 20. The power semiconductor 300 is not limited in particular, but may be IGBT, MOSFET, Diode, or the like.

In such a cooling device 100 for an electronic component, in order to cool off the power semiconductor 300 that is generating heat, a coolant is supplied through one of the nozzles 52. The coolant passes through the diameter expansion portion 51 from the nozzle 52 to flow into the metal pipe 50, and then flows to the other diameter expansion portion 51 to flow out from the nozzle 52. Meanwhile, heat from the power semiconductor 300 is transferred to the metal foil 20 via a solder layer 310, and the heat is then transferred from the metal foil 20 to the heat conductive resin layer 10. Further, the heat transferred from the resin layer 10 expands to the whole tube wall of the metal pipe 50 due to heat conduction, and is cooled off by the coolant flowing through the metal pipe 50.

In the cooling device 100 for an electronic component according to the present embodiment, voids, including very small voids, existing in the respective adhesive interfaces between the metal foils 20 and the resin sheets 10b and between the resin sheets 10b and the metal pipe 50 can be reduced, so that a heat transfer area becomes larger than that in a case where there are many voids in the adhesive interfaces, and electronic components such as the power semiconductor can be cooled off efficiently in a state where the function of electric insulation from the electronic components is maintained.

The preferred embodiment of the present invention has been described in detail as above, but the present invention is not limited to the above embodiment and various modifications may be made.

For example, in the above embodiment, a configuration in which the metal pipe 50 does not have any inner tube has been described. However, an inner tube may be provided in the metal pipe 50. If the number of inner tubes is increased, the heat transfer area is increased accordingly, which further increases the cooling efficiency.

Furthermore, in the above embodiment, a configuration in which both side surfaces of the metal pipe 50 are round has been described. However, the side surfaces need not be round and may be square-shaped. Further, the metal pipe 50 may be bent.

Moreover, in the above embodiment, a configuration in which a plurality of laminated bodies each including the resin layer 10 and the metal foil 20 are laminated on a single metal pipe 50 has been described. However, the number of laminated bodies each including the resin layer 10 and the metal foil 20 and laminated on the metal pipe 50 need not be multiple but may be one.

Furthermore, in the above exemplary use, a case where the present invention is used as a cooling device for the power semiconductors 300 has been described. However, in the cooling device for an electronic component according to the present invention, the electronic components are not limited to the power semiconductors.

INDUSTRIAL APPLICABILITY

With the cooling device for an electronic component according to the present invention, the efficiency of cooling electronic components can be increased sufficiently, and therefore downsizing and weight saving of the cooling device can be achieved. In view of this, the cooling device for an electronic component of the present invention can be used advantageously in the field of electric vehicles, fuel cell vehicles, hybrid electric vehicles, and the like in which downsizing and weight saving of a device to be mounted are required.

BRIEF DESCRIPTION OF REFERENCE NUMERALS

10: resin layer 10b: resin sheet 20: metal foil 30: laminated body 50: metal pipe 50a: positions at which are laminated on the resin layer of the metal pipe 50 51: diameter expansion portion 52: nozzle 60, 70: flexible container 60c, 70c: side tube 60e: end portion of the flexible container 60 70a: upper mold 70b: bottom mold 80: autoclave 80h: heater 80P: pump 100, 110: cooling device for an electronic component 300: power semiconductor 310: solder layer L1: vacuum line

The invention claimed is:

1. A method for manufacturing a cooling device for an electronic component, comprising:
  an accommodation step of accommodating, in a flexible container, a structure including a metal pipe, a thermosetting resin sheet at a B-stage, which is laminated on an external surface of the metal pipe, and a metal foil laminated on the resin sheet;
  a pressure reduction step of reducing pressure in the flexible container;
  a pressure application step of applying pressure by gas to the flexible container in which the pressure has been reduced, from an outside; and
  a heating step of heating the resin sheet in a state where the pressure reduction and the pressure application have been performed,
  the metal pipe being provided with, at respective ends of the metal pipe, diameter expansion portions and nozzles via the diameter expansion portions,
  the flexible container having a tubular shape, or including a pair of flexible molds having a shape of an internal surface corresponding to a shape of an external surface of the metal pipe, and
  the accommodation step of accommodating, in the flexible container, the structure such that the diameter expansion portions and the nozzles provided at the respective ends of the metal pipe come out from the flexible container.

2. The method for manufacturing a cooling device for an electronic component according to claim 1, further comprising, after the heating step, an annealing step of taking out the structure from the flexible container and heating the resin sheet at a temperature higher than that in the heating step.

* * * * *